(12) United States Patent
Davidson

(10) Patent No.: US 6,400,576 B1
(45) Date of Patent: *Jun. 4, 2002

(54) SUB-PACKAGE BYPASS CAPACITOR MOUNTING FOR AN ARRAY PACKAGED INTEGRATED CIRCUIT

(75) Inventor: Howard L. Davidson, San Carlos, CA (US)

(73) Assignee: Sun Microsystems, Inc., Palo Alto, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/286,250

(22) Filed: Apr. 5, 1999

(51) Int. Cl.$^7$ ................................. H05K 7/02
(52) U.S. Cl. .................. 361/763; 361/734; 361/761; 361/768; 361/780; 361/782; 361/783; 361/808; 361/818; 174/262; 257/698; 257/724; 257/728; 333/12; 438/125; 29/831; 29/832
(58) Field of Search ............................. 361/734, 761, 361/763, 764, 767, 768, 770, 780, 782, 783, 792–794, 907, 808, 810, 811, 820, 821; 174/255, 260, 262–264, 266; 333/12, 247; 257/691, 698, 723, 724, 728, 924, 532, 535; 438/106, 108, 125, 239, 243, 253, 381, 386, 393, 637; 324/765; 439/69, 71; 365/51, 52

(56) References Cited

U.S. PATENT DOCUMENTS 4,667,267 A  5/1987 Hernandez et al. ...... 361/306.2
5,177,594 A  1/1993 Chance et al. ............ 257/723

(List continued on next page.)

FOREIGN PATENT DOCUMENTS

EP  0145694  6/1985

OTHER PUBLICATIONS

International Application No. PCT/US00/08564 Search Report, dated Mar. 31, 2000.

Primary Examiner—Jayprakash N. Gandhi
Assistant Examiner—John B. Vigushin
(74) Attorney, Agent, or Firm—Conley, Rose & Tayon, PC; B. Noël Kivlin

(57) ABSTRACT

Switching noise within an LGA-packaged or PGA-packaged IC Vdd and IC Vss nodes is reduced by spreading the electrical current in the bypass path to reduce the effective current loop area, and thus reduce the energy stored in the magnetic field surrounding the current path. This result is achieved by minimizing the horizontal components of the linkage paths between the IC nodes to be bypassed and the bypass capacitor. Since effective inductance Leff seen by the bypass capacitor is proportional to magnetic energy, Leff is reduced over a broad band of frequencies. For each bypass capacitor, a pair of conductive vias is formed. A first via is coupled to the LGA package Vcc plane and to the IC Vdd node, and a second via is coupled to the LGA package Vss plane and to the IC Vss node. These vias preferably are spaced-apart a distance $\Delta X$ corresponding to the distance between first and second connections on the bypass capacitor although sub-mm offsets in a via at connections may be used to accommodate differing connection pitches. The bypass capacitor connections are coupled to the lower surfaces of the first and second vias, at the lower surface of the LGA package. When the package is inserted into a socket, the bypass capacitor extends into at least some of the otherwise unused recess in the socket. Multiple bypass capacitors are accommodated by forming additional spaced-apart vias that may be electrically parallel-coupled.

31 Claims, 4 Drawing Sheets

U.S. PATENT DOCUMENTS

| | | | | |
|---|---|---|---|---|
| 5,309,324 A | * | 5/1994 | Hernandez et al. | 361/734 |
| 5,475,317 A | * | 12/1995 | Smith | 324/760 |
| 5,608,261 A | * | 3/1997 | Bhattacharyya et al. | 257/724 |
| 5,615,089 A | * | 3/1997 | Yoneda et al. | 361/764 |
| 5,629,240 A | * | 5/1997 | Malladi et al. | 438/106 |
| 5,694,297 A | | 12/1997 | Smith et al. | 361/785 |
| 5,741,729 A | * | 4/1998 | Selna | 438/125 |
| 5,798,567 A | | 8/1998 | Kelly et al. | 257/723 |
| 5,939,782 A | * | 8/1999 | Malladi | 257/698 |
| 5,973,928 A | * | 10/1999 | Blasi et al. | 361/763 |
| 6,272,020 B1 | * | 8/2001 | Tosaki et al. | 361/761 |

* cited by examiner

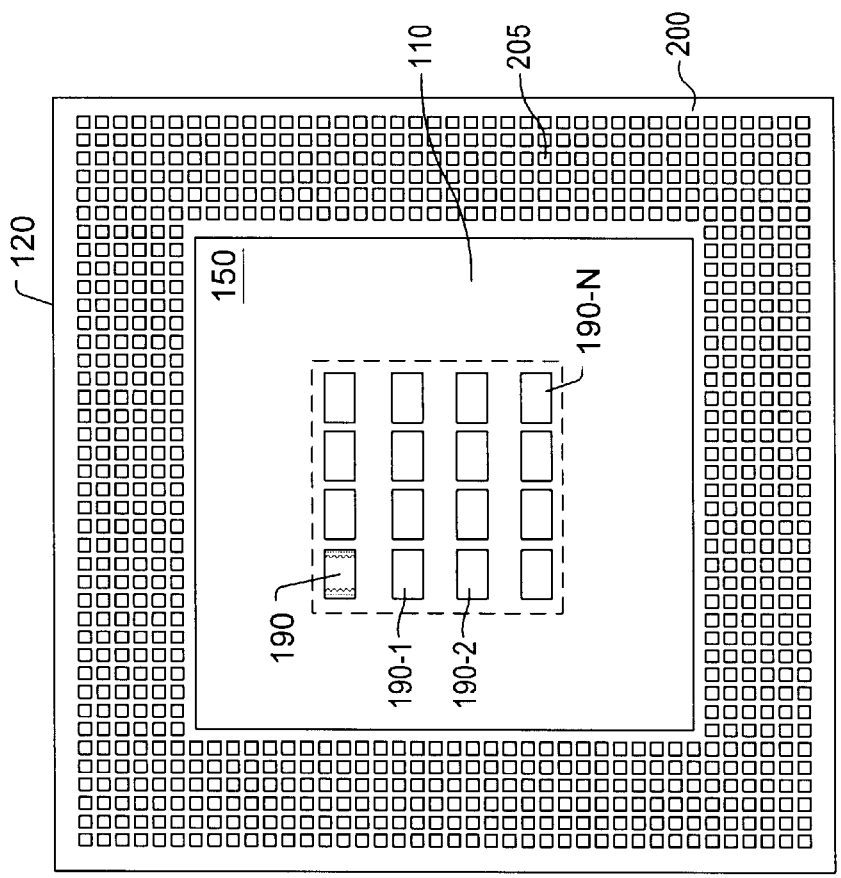
FIG. 4
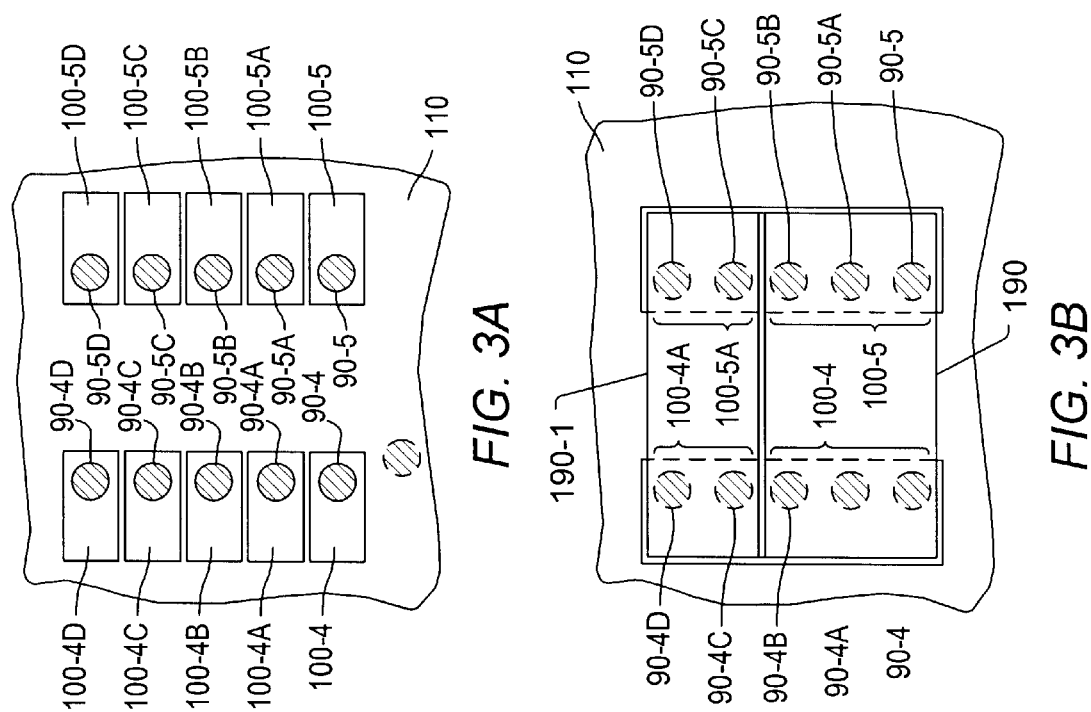
FIG. 3A
FIG. 3B

US 6,400,576 B1

SUB-PACKAGE BYPASS CAPACITOR MOUNTING FOR AN ARRAY PACKAGED INTEGRATED CIRCUIT

BACKGROUND OF THE INVENTION

1. Field of the Invention

This invention relates to providing integrated circuits ("ICs") with better broadband low impedance power feed than is possible with conventional IC bypass capacitor placement, and more particularly for effectiveness of bypass capacitors used with land grid array ("LGA") or pin grid array ("PGA") packaged high pin density ICs.

2. Related Art

Integrated circuits commonly include a number of metal-oxide-semiconductor ("MOS") transistors, bipolar transistors, diodes and/or other devices fabricated on a semiconductor substrate die that may ultimately be encapsulated within a protective package. Some nodes within the IC require external power supply voltages, ground, and signal connections. Such nodes are coupled within the encapsulation to IC pads to which with solder balls, pads, or the like may be attached. In this fashion, externally provided voltages and signals are coupled to the IC.

FIG. 1, for example, depicts a socketed assembly 10 that includes an IC 20 with associated solder balls 30-1, 30-2 . . . 30-10 mounted on a land grid array ("LGA") package 40, typically ceramic or a plastic material, depending upon ambient temperature specifications. The invention described later herein is also suitable for pin grid array ("PGA") packages and as used herein, the term LGA will be understood to also include PGA.

The upper surface 50 of LGA package 40 will define a number of component conductive pads 60-1, . . . 60-10 that make electrical connection to the IC package solder balls when IC 20 is mounted to the LGA package, e.g., by soldering. Within LGA package 40 conductive planes are formed such as Vcc plane 70 used to carry operating potential Vcc, and Vss plane 80 used to carry a reference potential Vss that is often ground. LGA package 40 may include more than two conductive planes 70, 80 and typically will have a thickness (measured between surfaces 50 and 110) in the range of perhaps 1 mm to 6 mm. The length and width of the LGA package may be 50 mm×50 mm or larger.

Vertically formed electrically conductive vias such as 90-1, 90-4, 90-5, 90-10 are formed within package 40. These vias permit chosen component conductive pads 60-1, 60-4, 60-5, 60-10 on surface 50 of LGA 40 to make desired electrical connection to Vcc plane 70, or Vss plane 80, and/or LGA mounting pads 100-1, 100-4, 100-5, 100-10 on lower surface 110 of LGA 40. The fabrication of such vias is well known in the relevant art, and will not be described herein.

In FIG. 1A, solder balls 30-1 and 30-10 are coupled internally to nodes formed on IC 20 carrying input or output signals. Solder balls 30-1 and 30-10 make electrical connection to conductive pads 60-1 and 60-10 on the upper surface of the LGA package. In turn, these conductive pads make electrical contact respectively with vias 90-1 and 90-10 to respective LGA mounting pads 100-1 and 100-10 on the lower surface of the LGA package. Because vias 90-1 and 90-10 carry input or output signals, these vias pass through openings in planes 70 and 80 without making electrical contact to either plane.

Solder balls 30-4 and 30-5 are electrically coupled internally to nodes on IC 20 that require Vcc-and Vss potential, respectively. Thus, solder balls 30-4 and 30-5 are respectively electrically coupled to conductive pads 60-4 and 60-5 on the upper surface of the LGA package. Pad 60-4 is electrically coupled to Vcc plane 70 (but not to Vss plane 80) with via 90-4 and to LGA mounting pad 100-4 on the lower surface 110 of the LGA package. Similarly pad 60-5 is electrically coupled to Vss plane 80 (but not to Vcc plane 70) with via 90-5 and to LGA mounting pad 100-5 on the lower surface of the LGA package.

In use, LGA package 40 is inserted into an LGA socket 120 that is mounted to a motherboard or other substrate 130 that provides IC 20 with Vcc, Vss, and input and output signal access through socket contacts 140-1, 140-4, 140-5, 140-10. Socket 120 commonly is shaped as a rectangular or square frame with socket contacts including 140-1, 140-2, etc. located on the socket periphery. As such, a square or rectangular opening (or at least a recess) 150 is defined in the lower central portion of the socket.

In practice, IC 20 may include circuitry requiring relatively noise-free potential at Vcc and Vss component conductive pads 60-4, 60-5 for reliable IC operation. By noise-free, it is meant that ideally signals at these pads should be pure DC, with essentially no AC transient components or crosstalk-coupled components. Some Ics are notorious for generating electrical noise. For example, high speed digital ICs exhibit rapid voltage and current transitions that can produce unwanted current surges and voltage spikes at the Vcc and Vss component conductive pads.

It is known in the art to reduce such noise on Vcc and Vss component conductive pads by coupling one or more bypass capacitors in shunt with these pads. Thus, in FIG. 1, it is common to dispose one or more bypass capacitors 160, 170 on upper surface 50 of LGA 40. The capacitors make electrical connection through solder balls (or the like) 30-20, 30-21, 30-22, 30-23 to capacitor component conductive pads 60-20, 60-21, and 60-22, and 60-23, and then through vias 90-20, 90-21, and 90-22, 90-23 to the Vcc plane 70 and the Vss plane 80 respectively. Ideally, each capacitor represents a low shunt impedance to high frequency transients, while representing a high shunt impedance to DC voltages.

Bypass capacitors 160, 170 may be in the 0.1 $\mu$F range, depending upon the noise susceptibility characteristics of the IC(s) being bypassed. Typical dimensions for a conventional off-the-shelf 0.1 $\mu$F bypass capacitor are in the range of perhaps 6 mm×3 mm surface area, by 0.8 mm height.

Unfortunately, the mounting configuration for bypass capacitors 160, 170 shown in FIG. 1 is less than optimum to provide substantially noise-free signals for IC 20 at component conductive pads 60-4, 60-5. Simply stated, the horizontal and lateral electrical path lengths between the capacitors and the nodes being bypassed are too long, with the result that the effective (undesired) parasitic series inductance (Leff) is too large. Consider the path length from capacitor 160 to component conductive pad 60-4. The height of via 90-22 may be a few mm, the lateral separation of via 90-22 from via 90-5 may be 30 mm, and the distance along via 90-5 upward to pad 60-5 will be a few mm, a total distance of perhaps 35 mm or more.

As shown in FIG. 1B, effective bypassing is compounded by the fact that at high frequencies, the Vcc, Vss conductive paths, e.g., 70, 80, may themselves be equivalent to a distributed series of series-coupled parasitic resistor (R) and inductor (L) combinations with parasitic capacitance shunts (C) at the equivalent coupling nodes. Further, the various bypass capacitors, e.g., 160, 170, have parasitic resistance Rs and inductance Ls coupled in series with the capacitor leads. In FIG. 1B, the connection linkage path from IC 20 to bypass capacitor 160 (or 170) is shown with bold lines for emphasis. It will be appreciated that at high currents and/or high frequencies, L1, R1, C1, L2, R2, C2 in the linkage paths, as well as Rs and Ls can degrade the effectiveness of the bypass capacitor 160 or 170. A more detailed discussion of circuit models of parasitic components that can affect capacitor bypassing may be found in the treatise *Digital Systems Engineering* by W. J. Dally and J. W. Poulton, published by Cambridge University Press, especially portions of Chapter 5 therein.

The relatively long linkage path length between the bypass capacitor and an IC node to be bypassed, shown with bold lines in FIG. 1B, contributes to the overall effective parasitic inductance (Leff), resistance (Reff), and associated shunt capacitance (Cshunt) seen by bypass capacitor 160 or 170. A non-zero value of Leff undesireably increases the magnitude of current-induced voltage spikes (E), often termed "ground bounce", according to the relationship:

$$E \approx L_{\mathit{eff}} \cdot \frac{\delta i}{\delta t} \tag{1}$$

It is further seen from equation (1) that the magnitude of $\delta i/\delta t$ increases with higher switching speeds (e.g., smaller $\delta t$) associated with digital ICs. In general, increasing the effective value C of a bypass capacitor (e.g., 160, 170 in FIG. 1) preferably is accomplished by parallel-coupling a number of smaller valued capacitors. This configuration parallel-couples the series inductance associated with each of these capacitors, and the result is a more effective bypass than if a single larger value C were used. Ideally, the nominal impedance (Z) of a bypass capacitor (C) would vary inversely with frequency ($\omega$) according to the relationship:

$$Z = 1/j\omega C, \text{ where } j = \sqrt{-1} \tag{3}$$

Unfortunately, real capacitors have associated with them a series inductance and a series resistance. The effective impedance presented by a real capacitor can never be less than its series resistance. But at high frequencies, the Vcc and Vss planes can act as radial transmission lines. The result is that a higher than ideal impedance is presented for each bypass capacitor, due to an upward transformation by these planes, as seen from the connector power and ground pins on the die of IC 20. From equation (3) it is evident that this upward transformation is tantamount to a reduction in the effectiveness of bypass capacitor C.

Associated with a given capacitor C will be a self resonant frequency $\omega_O$ given by:

$$\omega_o = \frac{1}{\sqrt{L_{\mathit{eff}} \cdot C}} \tag{4}$$

where Leff is effective inductance seen by the bypass capacitor. The significance of equation (4) is that effective bypassing occurs in a frequency band in which the combination of Leff and C has an impedance that is substantially less than the effective series resistance (ESR). However, it will be appreciated from the foregoing that Leff decreases self-resonant frequency $\omega_O$, This is inapposite to the design goal of producing a broadband bypass power feed, characterized by a broadband low impedance and a high $\omega_O$, since above the self-resonant frequency, effective capacitor bypassing simply does hot occur.

From equations (1) and (2) it will be appreciated that more effective bypassing could result from mounting one or more bypass capacitors on the IC itself. Indeed U.S. Pat. No. 5,629,240 (1997) to Malladi et al. discloses a method for directly attaching a bypass capacitor to the IC itself, thus substantially reducing the path length of the connecting linkages (L1, R1, C1, L2, R2, C2), and thus reducing Leff. Chip package constraints limit the magnitude of Malladi's on-chip bypass capacitor to perhaps 100 nF. However, the Malladi patent highlights the need to reduce series inductance in providing an effective bypass capacitor. For purposes of the present invention, IC 20 cannot be modified to include a Malladi-type direct attachment of a bypass capacitor to IC 20.

In short, there is a need for a more effective technique for mounting a bypass capacitor for use with a socket-mounted LGA package (or a PGA package). Preferably such mounting should be useable with conventional off-the-shelf bypass capacitors, and should be implemented using standard LGA fabrication and mounting processes. The mounting should improve the impedance characteristics of the linkage paths between the bypass capacitor and the IC nodes to be bypassed, especially by reducing the effective series inductance seen by the bypass capacitor. Further, effective series inductance is reduced by disposing connecting vias and pads that effectively spread the current carried by the multiple source and return vias by minimizing the current loop area, which is to say, to reduce the energy stored in the effective inductance magnetic field. The resultant LGA mounted IC should see a lower impedance broadband power feed than would be available using prior art bypass capacitor mounting methods.

The present invention provides such mounting of bypass capacitors.

SUMMARY OF THE PRESENT INVENTION

Switching and other transient noise appearing at component mounting pads on an LGA (or PGA) packaged IC are reduced by mounting one or more bypass capacitors beneath the package. The LGA package with bypass capacitors so attached plugs into an LGA (or equivalent) socket, such that the capacitors are disposed within the socket recess or opening. The LGA package includes at least a Vcc plane and a Vss plane. IC nodes to be bypassed are coupled with vias to an underlying bypass capacitor attached to the LGA package lower surface. Because a bypass capacitor may now be disposed beneath the IC to be bypassed, there are substantially no horizontal components in the linkage lead paths between a bypass capacitor and the IC nodes to be bypassed. The capacitor-coupling vias and pads that carry current effectively minimize the current loop area, which is equivalent to reducing the energy stored in the magnetic field of the effective inductance. Since stored energy is proportional to Leff, the result decreases Leff, which increases the capacitor self-resonance frequency. The resultant lower bypass impedance is characterized by a broader band low impedance power feed at the IC than would be possible using conventional above-LGA package bypass capacitor mounting techniques.

Electrical connections between the IC Vcc and Vss pads and a sub-LGA package mounted bypass capacitor are made with spaced-apart first and second vias. The horizontal distance between the vias corresponds to the spaced-apart distance between first and second electrical contacts on the bypass capacitor. Thus, the first via couples one capacitor contact to the Vcc plane and to at least one IC Vcc component mounting pad. Similarly, the second via couples the second capacitor contact to the Vss plane and to at least one IC Vss component mounting pad. Because the bypass capacitor may be disposed beneath the IC, total path length from the IC to the bypass capacitor is essentially the vertical height of the connecting via, lateral path lengths are eliminated. Where necessary, a preferably sub-mm offset in a via may be provided, to accommodate spacing between electrical contacts on the bypass capacitor.

Multiple bypass capacitors may be used to bypass a common IC node, and multiple vias may be used for each capacitor connection. Conventional off-the-shelf bypass capacitors may be used, including capacitors used to bypass an IC chip that has an attached connector. Where necessary, the LGA socket may be modified to accommodate excessively thick bypass capacitors by deepening any recess.

Other features and advantages of the invention will appear from the following description in which the preferred embodiments have been set forth in detail, in conjunction with the accompanying drawings.

BRIEF DESCRIPTION OF THE DRAWINGS

FIG. 3A is a bottom view of an LGA package showing multiple mounting pads to accommodate multiple connections on a bypass capacitor and/or mounting multiple bypass capacitors, according to the present invention;

FIG. 3B is a bottom view of an LGA package showing attachment of multiple bypass capacitors, according to the present invention; and FIG. 4 is a bottom view of an LGA package showing attachment of multiple bypass capacitors, according to the present invention.

DETAILED DESCRIPTION OF THE PREFERRED EMBODIMENT

Figure 1A:
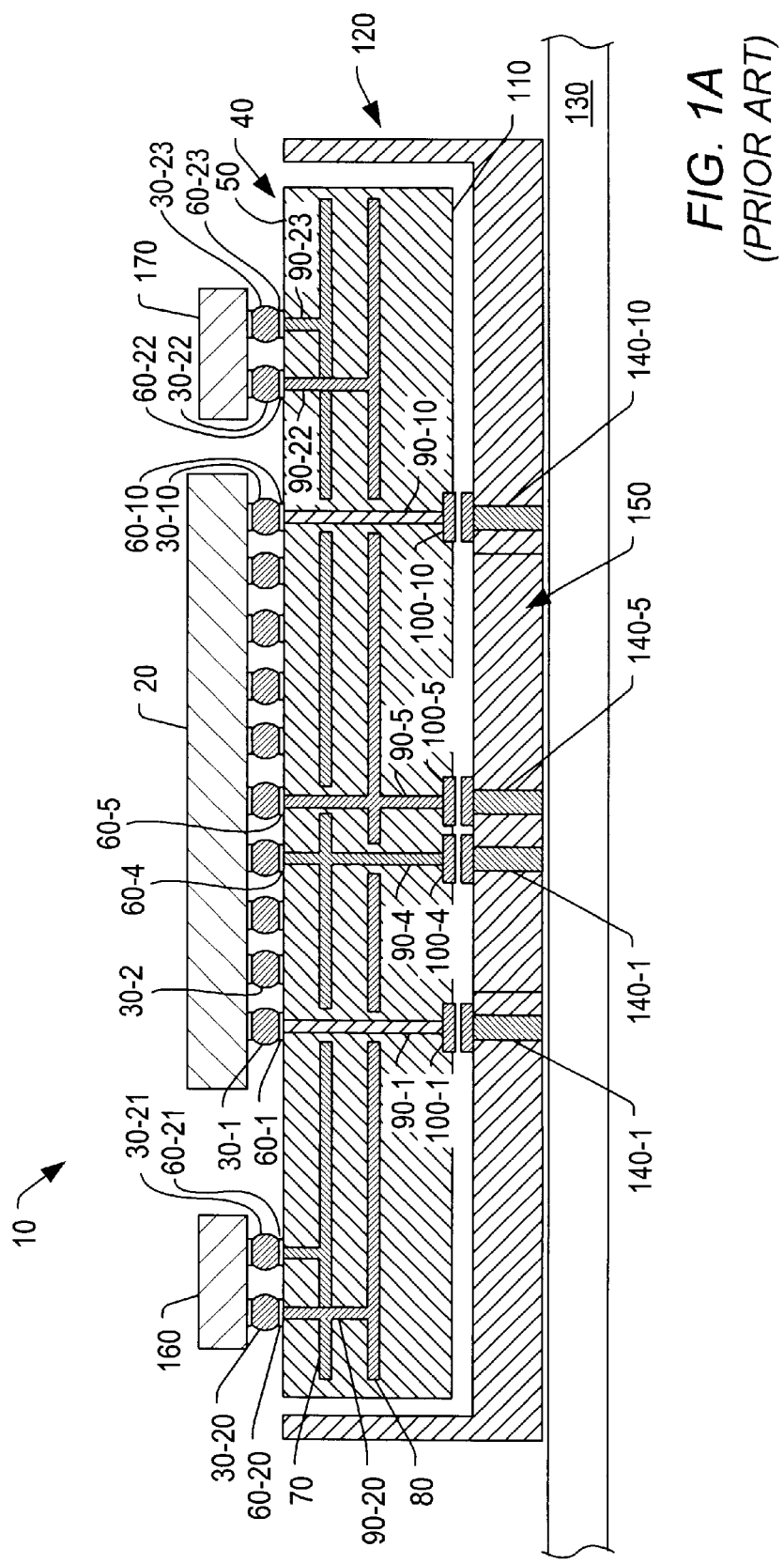
FIG. 1A is a cross-sectional view of an LGA-packaged IC with bypass capacitors mounted above the LGA package, according to the prior art.
Figure 2:
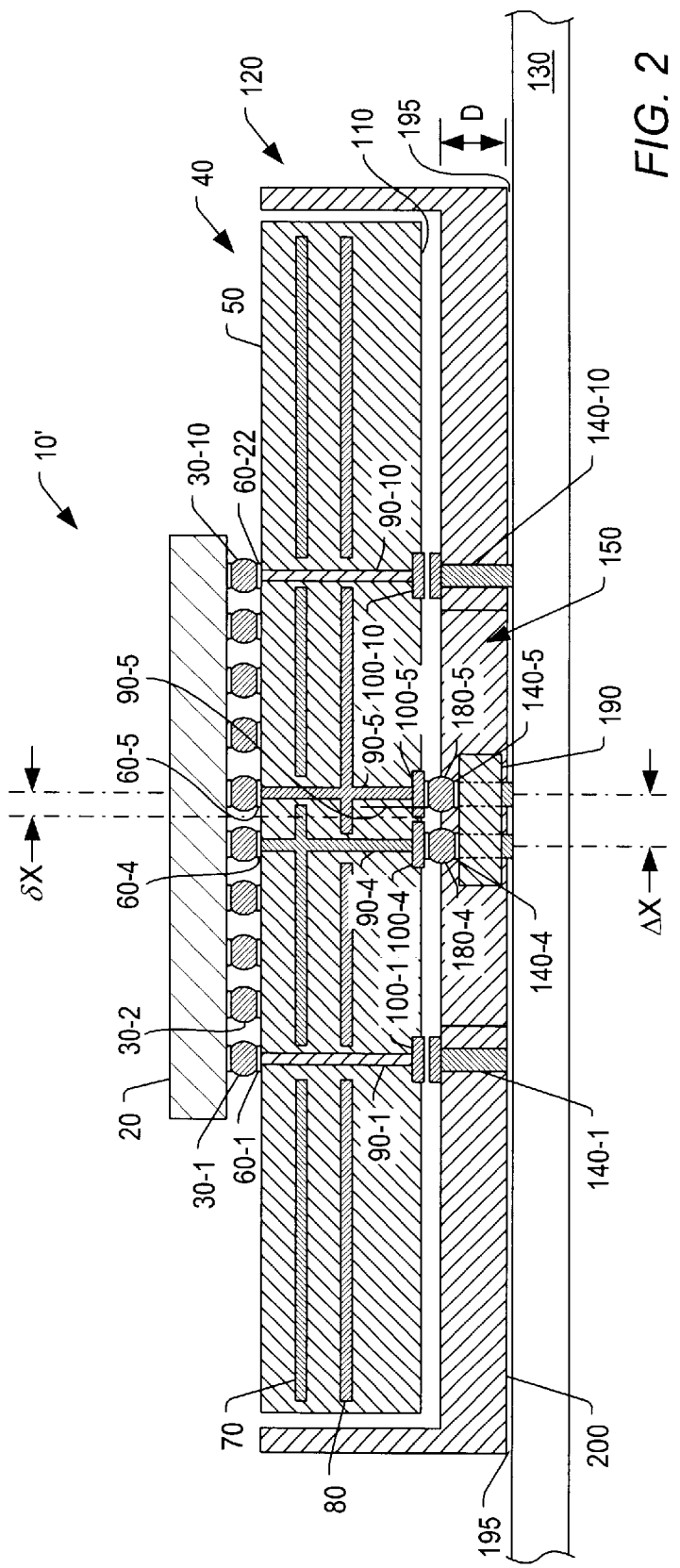
FIG. 2 is a cross-sectional view of an LGA-packaged IC with a bypass capacitor mounted beneath the LGA package, according to the present invention.

FIG. 2 depicts a socketed assembly 10' showing a cross-section of an LGA package 40 (or PGA type package) for an IC 20, which package and IC (or ICs) may be identical to what has been described in FIG. 1A. Unless otherwise noted, elements in FIGS. 2–4 bearing the same reference numerals used in FIG. 1A may be identical elements. Thus, package 40 will include at least a Vcc plane 70 that will carry operating potential Vcc, and a Vss plane 80 that will carry a reference potential Vss that may be ground.

As in FIG. 1A, vertically formed electrically conductive vias such as 90-1 and 90-10 carry signals that are not coupled to Vcc or to Vss. Relevant to the present invention, vias 90-4 and 90-5 are respectively coupled to Vcc plane 70 and to Vss plane 80. Vias 90-4 and 90-5 are also coupled to respective component conductive pads such as 60-4 and 60-5 that will conduct Vcc and Vss potential to nodes within IC 20.

Vcc plane 70 may be formed with an opening through which via 90-4 is formed and is then electrically coupled to plane 70 adjacent such opening. In similar fashion, Vss plane 80 may be formed with an opening through which via 90-5 is formed and is then electrically coupled to plane 80 adjacent such opening. An alternative formation would be to form portions of via 90-4 above and below plane 70, and portions of via 90-5 above and below plane 80. In this configuration, the plane-facing regions of these respective via portions would be electrically coupled to the respective plane 70 or plane 80.

According to the present invention, vias 90-4, 90-5 and LGA mounting pads 100-4, 100-5 are spaced-apart a predetermined lateral distance ΔX. Distance ΔX is selected to equal the nominal spaced-apart distance between solderballs or connections 180-4, 180-5 associated with bypass capacitor 190. As shown by the slightly transposed via portion 90'-5 extending beneath plane 70, a small lateral offset (typically <2 mm) within in a via may be provided, the better to accommodate distance ΔX if there is a mismatch between pitch spacing associated with IC pads and pad spacing with respect to the capacitor connections. By slight or small lateral offset, it is meant that δX<1 mm, and preferably <0.5 mm or so. However, if with such small lateral offsets, it will be appreciated that there is substantially no horizontal path lengths associated with capacitor connections.

In contrast to what was shown in FIG. 1A, in the present invention one or more bypass capacitors 190 are disposed beneath LGA-packaged IC 20, in a cavity, e.g., in what would otherwise be wasted space. So mounted, the capacitors are substantially directly beneath IC 20, within opening (or if present, recess) 150 in socket LGA 120. In terms of physical sizes and capacitance values, capacitor 190 may be identical to capacitor 160 or capacitor 170, as shown in FIG. 1A.

In practice, the vertical height of capacitor(s) 190 can readily be as large as the vertical depth of the body of LGA socket 120, a dimension of about 0.040"0 or about 1 mm for high performance sockets such as the Cin Apse sockets manufactured by Cinch, Inc. of Illinois. However when required, thicker capacitors may be accommodated by modifying the socket to increase the effective socket vertical depth ("D", see FIG. 2). The effective vertical depth D may be increase by removing any shelf portion of the socket that would otherwise underlie the bypass capacitor, to completely expose opening 150.

In some applications, if necessary, the lower surface of LGA socket 120 could intentionally be elevated 1 mm or so above the surface of substrate 130 with mounting washers 195. Washers 195 (or the like) would provide even greater vertical clearance between lower surface 200 of socket 120 and the upper surface of the underlying substrate 130. More preferably, the thickness of socket 120 would be increased.

The ability to dispose bypass capacitors substantially directly beneath IC 20 substantially eliminates lateral components from the electrical path between the bypass capacitor and the nodes to be bypassed. Thus, the path length between capacitor 190 and component conductive pads 60-4, 60-5 is essentially the vertical height of vias 90-4 or 90-5, a length of perhaps 1 mm to perhaps 6 mm, depending upon the thickness of LGA 40. Thus, beneficially absent from the configuration of FIG. 2 are the relatively long lateral runs required in prior art FIG. 1A to couple a bypass capacitor to the relevant component conductive pads 60-4, 60-5.

As a result, path lengths for below-LGA package (or sub-LGA package) mounted bypass capacitors may be reduced by from perhaps 50% to several hundred percent compared with conventional above-LGA package mounted capacitors.

The present invention effectively and advantageously disposes pads and vias that will be coupled to the bypass capacitor such that the electrical current is spread so that the current loop area is reduced. This in turn reduces the effective energy stored in the magnetic field surrounding the current path, which effectively reduces Leff (which is proportional to the stored energy).

Figure 1B:
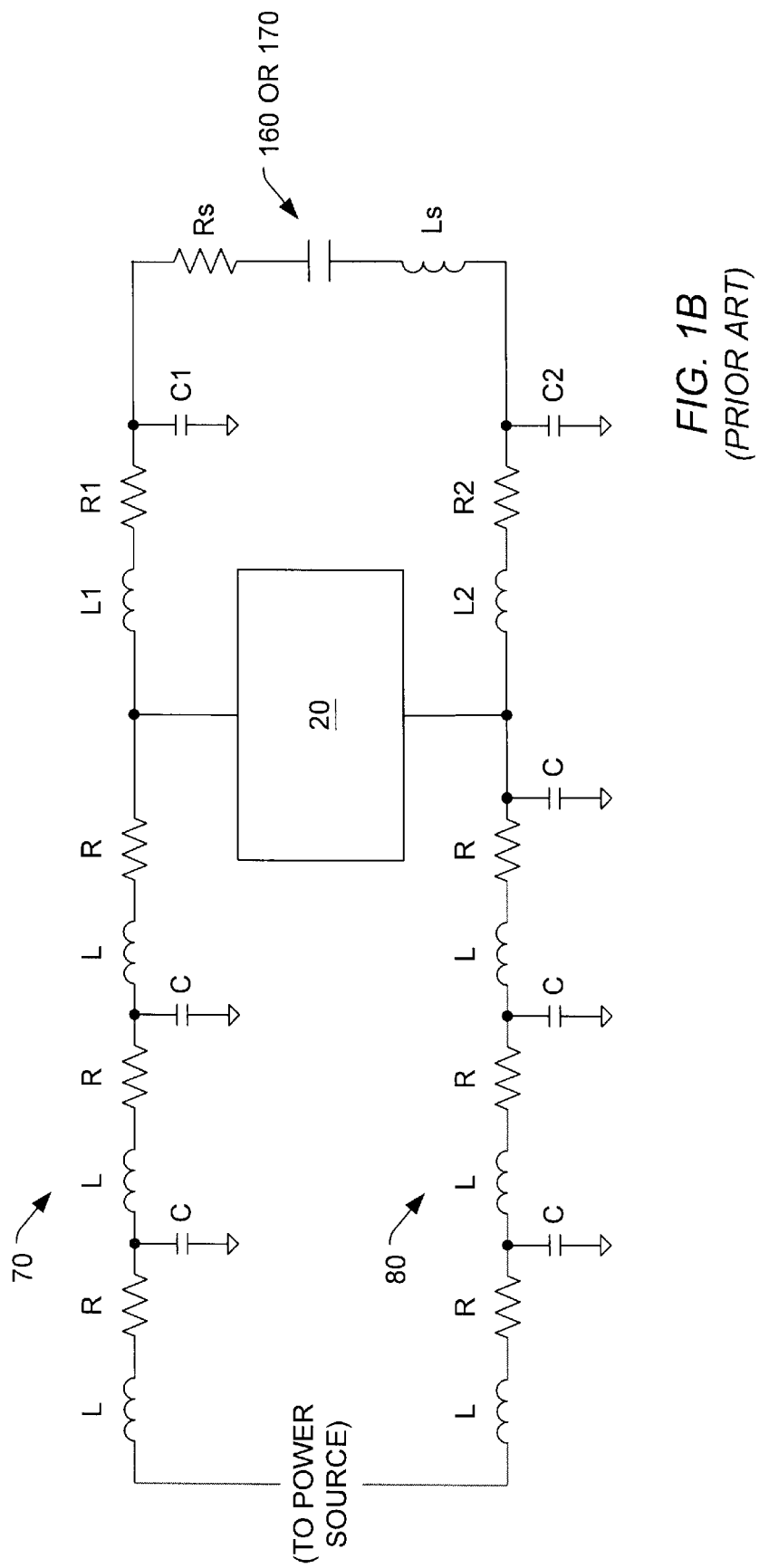
FIG. 1B is a model depicting distributed parasitic components that can affect capacitor bypassing.

The reduced linkage paths between IC nodes to be bypassed and the bypass capacitor thus substantially reduces the magnitude of Leff, to achieve lower impedance bypassing over a broad frequency band. It is seen from equation (1) that at Leff decreases, voltage spikes E decrease, which means effective bypassing is enhanced. High frequency switching noise within IC 20 is now more effectively bypassed, relative to the performance of the prior art configuration of FIG. 1.

A given level of bypass performance is achieved with a smaller value below-LGA mounted bypass capacitor as shown in FIG. 2 than is attained with prior art above-LGA package mounting, as shown in FIG. 1A. Alternatively, the same magnitude bypass capacitor mounted below an LGA-package as shown in FIG. 2 will provide substantially better bypass performance than if mounted above the LGA package, as shown in FIG. 1A.

Generally capacitor 190 is attached to LGA mounting pads 100-4, 100-5 by applying heat. Solderballs 180-4, 180-5 melt, and electrically connect and attach capacitor 190 to the LGA mounting pads. In some applications, solderballs 180-4, 180-5 may be replaced with dabs of conductive adhesive, conductive epoxy for example. Mechanical attachment of the bypass capacitors may be augmented by the addition of a layer of adhesive between the bypass capacitors and the facing surface of the LGA package. Of course the present invention could also be practiced with IC chip packages that have an attached connector.

It will be appreciated that more than one bypass capacitor 190 may be used to provide bypassing for a pair of nodes within IC 20. It is common practice to use parallel-coupled bypass capacitors of different capacitances, each capacitor having a different self-resonant frequency. The resultant plurality of parallel-coupled bypass capacitors can present a broader band of frequencies over which low impedance is provided, than if a single larger capacitance bypass capacitor were used. For example, perhaps it is determined that effectively capacitor 190 should be 0.122 $\mu$F. From the perspective of FIG. 2, it will be appreciated that additional capacitors may be disposed "behind" capacitor 190, with the first capacitor connections coupled in parallel, and with the second capacitor connections coupled in parallel, and so on. For example, if 0.122 $\mu$F is required to bypass component conductive pads 60-4, 6-5, this magnitude of bypassing can be achieved by making capacitor 190 0.1 $\mu$F, and by mounting an additional 0.022 $\mu$F capacitor 190-1 "behind" capacitor 190. Both 0.1 $\mu$F and 0.022 $\mu$F are standard values for off-the-shelf (e.g., non-customized) capacitors.

Such mounting of additional capacitors is best seen with references to FIGS. 3A, 3B and 4. FIG. 3A shows a bottom view of LGA package 40 in which a plurality of first vias 90-4, 90-4A, . . . 90-4D is formed, as well as a plurality of second vias 90-5, 90-5A, . . . 90-5E. It is understood that the opposite end of each first via is coupled to Vcc plane 70 and to at least one IC Vcc node, and that the opposite end of each second via is coupled to the Vss plane 80 and to at least one IC Vss node.

Although FIG. 3A depicts formation of five pairs of vias, it is understood that a greater or smaller number of vias may be formed, and that the locus of similar first or second vias need not be in a single line. It is also understood that the vias need not align in a line as shown. For example, so-called interdigitated contact capacitors seek to lower effective inductance by cancelling electromagnetic fields by alternative positive and negative capacitor connector locations. Such capacitors are available commercially from AVX, Inc. Electrical connections to such capacitors need not be in a straight line, as shown in FIG. 3A.

As shown in FIG. 3A, preferably dedicated mounting pads, e.g., 100-4, 100-4A, . . . 100-4D, 100-5, 100-5A, . . . 100-5D are provided for the various first or second vias, although less favorably, common mounting pads for the first vias and for the second vias could be used in some applications.

Although FIG. 3A depicts a bottom view, it is to be understood that the various pads 100-4, 100-4A . . . 100-4D, 100-5, 100-5A, . . . 100-5D could in fact be formed at the upper surface 50 of LGA package 40. Adopting the nomenclature of FIG. 2, if formed at upper surface 50, such pads would be denoted conductive pads 60-4, 60-4A, . . . 60-4D, 60-5, 60-5A, . . . 60-5D, etc. Accordingly, FIG. 3A is understood to depict such alternative pads as well. of course, upper surface pads 60-4 (superimposed in FIG. 3A on 100-4,), 60-4A (100-4A), etc., 60-5 (superimposed in FIG. 3A on 100-5), 60-5A, etc. and the lower surface pads 100-4 . . . 100-5D may preferably be formed in the same LGA package. Multiple pads may be formed at the upper and lower surfaces of an LGA package can further help reduce effective series inductance Leff, to help achieve a lower impedance high frequency bypass.

FIG. 3B depicts a bottom view of LGA package 40. FIG. 3B depicts a configuration in which bypass capacitor 190 is coupled between vias 90-4, 90-4A, 90-4B and vias 90-5, 90-5A, and 90-5B. Similarly, a second capacitor 190-1 is shown coupled between vias 90-4C and 90-4D, and vias 90-5C and 90-5D. Although not necessarily a preferred configuration, FIG. 3B depicts common elongated pads 100-4 and 100-5 associated with capacitor 190, and common elongated pads 100-4A and 100-5A associated with capacitor 190-1. In this configuration, capacitor 190 may be 0.1 $\mu$F, while capacitor 190-1 would be 0.022 $\mu$F, to provide a combined effective 0.122 $\mu$F bypass capacitor.

FIG. 4 is a bottom view of LGA socket 120, showing the lower socket surface 200, opening 180 through which lower surface 110 of LGA package 40 is visible. FIG. 4 shows a plurality of bypass capacitors 190, 190-1, . . . 190-N attached to conductive vias at the lower surface of LGA package 40, according to the present invention. Also seen in FIG. 4 is a grid-like array of socket pads 205. Various of these pads couple signals to or from IC 20 (or multiple ICs mounted on LGA package 40) to substrate 130, as well as Vcc and Vss potentials. Although FIG. 4 depicts a symmetrical array of equally sized bypass capacitors, it is understood that the bypass capacitors may have different dimensions and need not be arranged in a symmetrical configuration. It is also understood, that FIG. 4 generally may depict a LGA or a PGA configuration.

From the foregoing description it will be appreciated that the present invention enables mounting of generic off-the-shelf capacitors. Because the capacitors are mounted substantially directly beneath the IC nodes to be bypassed, in otherwise unused space, there is substantially no horizontal component to the electrical path length between the capacitor connections and the IC nodes to be bypassed. The result is a lower effective series parasitic inductance Leff, which decreases effective bypass impedance.

Modifications and variations may be made to the disclosed embodiments without departing from the subject and spirit of the invention as defined by the following claims.

What is claimed is:

1. A grid array packaged integrated circuit (IC), including a sub-package mounted bypass capacitor, said packaged IC, with said bypass capacitor, mountable in a socket that defines a recess sized to accept said bypass capacitor, the packaged IC comprising:

said IC, including an IC Vss node and an IC Vcc node, and mounted on a package;

said package including a Vcc plane to which said IC Vcc node is coupled and that includes a Vss plane to which said IC Vss node is coupled;

a socket into which said packaged IC is inserted, wherein said bypass capacitor is disposed within at least a recess defined in said socket;

a first conductive via formed, in said package to which said IC is mounted, between said IC Vcc node and a lower surface of said package;

a second conductive via, spaced-apart a distance $\Delta X$ from said first conductive via, formed, in said package, between said IC Vss node and said lower surface of said package, said distance $\Delta X$ approximating a spaced-apart distance between a first connection and a second connection on said bypass capacitor;

said bypass capacitor being mounted adjacent a lower surface of said package such that said first connection on said bypass capacitor makes electrical contact with a lower portion of said first conductive via, and said second connection on said bypass capacitor makes electrical contact with a lower portion of said second conductive via.

2. The packaged IC of claim 1, further including a component conductive pad in electrical contact with an upper surface of at least one of said first conductive via and said second conductive via.

3. The packaged IC of claim 2, further including a mounting pad in electrical contact with a lower surface of at least one of said first conductive via and said second conductive via.

4. The packaged IC of claim 1, further including a mounting pad in electrical contact with a lower surface of at least one of said first conductive via and said second conductive via.

5. The packaged IC of claim 1, further including a solderball in series between at least one of (i) said IC Vcc node and an upper surface of said first conductive via, and (ii) said IC Vss node and an upper surface of said second conductive via.

6. The IC of claim 1, further including:

a second bypass capacitor having a first connection and a second connection, spaced apart therefrom a distance $\Delta X1$;

a third conductive via formed, in said package between an extension of said IC Vcc node and a lower surface of said package;

a fourth conductive via, spaced-apart said distance $\Delta X1$ from said third conductive via, formed, in said package, between an extension of said IC Vss node and said lower surface of said package;

said second bypass capacitor being mounted adjacent a lower surface of said package such that said first connection on said second bypass capacitor makes electrical contact with a lower portion of said third conductive via, and said second connection on said second bypass capacitor makes electrical contact with a lower portion of said fourth conductive via.

7. The packaged IC as recited in claim 1, wherein said socket is an LGA socket and said package is an LGA package.

8. The packaged IC as recited in claim 1, wherein said socket is a PGA socket and said package is a PGA package.

9. For an integrated circuit (IC) that includes an IC Vss node and an IC Vcc node and is mounted on a grid-arrayed package that has a Vcc plane to which said IC Vcc node is coupled, and has a Vss plane to which said IC Vss node is coupled, a method of coupling a bypass capacitor between said IC Vcc node and said IC Vss node, the method comprising the following steps:

(a) forming a first conductive via between said IC Vcc node and a lower surface of said package;

(b) forming a second conductive via, spaced-apart a distance $\Delta X$ from said first conductive via, between said IC Vss node and said lower surface of said package, said distance $\Delta X$ approximating a spaced-apart distance between a first connection and a second connection on said bypass capacitor;

(c) electrically coupling said first connection of said bypass capacitor to a lower portion of said first conductive via;

(d) electrically coupling said second connection of said bypass capacitor to a lower portion of said second conductive via; and (e) mounting said package in a socket, wherein said socket has a vertical depth exceeding a vertical depth of said bypass capacitor, and wherein said bypass capacitor is disposed within a cavity defined by said socket.

10. The method of claim 1, wherein at least one of step (a) and step (b) includes forming a component conductive pad in electrical contact with an upper surface of a chosen one of said first conductive via and said second conductive via.

11. The method of claim 1, wherein at least one of step (c) and step (d) includes forming a mounting pad in electrical contact with a lower surface of a chosen one of said first conductive via and said second conductive via.

12. The method of claim 1, wherein step (a) includes forming a component conductive pad in electrical contact with an upper surface of said first conductive via, and forming a mounting pad in electrical contact with a lower surface of said first conductive via.

13. The method of claim 12, wherein step (b) includes forming a component conductive pad in electrical contact with an upper surface of said second conductive via, and forming a second mounting pad in electrical contact with a lower surface of said second conductive via.

14. The method of claim 13, wherein step (d) includes disposing a solderball in series between said mounting pad and a second connection on said bypass capacitor.

15. The method of claim 12, wherein step (c) includes disposing a solderball in series between said mounting pad and a first connection on said bypass capacitor.

16. The method of claim 1, wherein at least one of step (a) and step (b) further includes disposing a solderball in series in at least one location selected from a group consisting of (i) a location between said IC Vcc node and an upper surface of said first conductive via, and (ii) a location between said IC Vss node and an upper surface of said second conductive via.

17. The method of claim 1, further including mounting a second bypass capacitor between said IC Vcc node and said IC Vss node, the method further comprising:

(a-1) forming a third conductive via between said IC Vcc node and a lower surface of said package;

(b-1) forming a fourth conductive via, spaced-apart a distance ΔX1 from said third conductive via, between said IC Vss node and said lower surface of said package, said distance ΔX1 approximating a spaced-apart distance between a first connection and a second connection on said second bypass capacitor;

(c-1) electrically coupling said first connection of said second bypass capacitor to a lower portion of said third conductive via; and (d-1) electrically coupling said second connection of said second bypass capacitor to a lower portion of said fourth conductive via.

18. The method of claim 17, wherein at least one of step (a-1) and step (b-1) includes forming a component conductive pad at an upper surface of said package electrically coupling an upper surface of a chosen one of said third conductive via and said fourth conductive via.

19. The method of claim 17, wherein at least one of step (c-1) and step (d-1) includes forming a mounting pad in electrical contact with a lower surface of a chosen one of said third conductive via and said fourth conductive via.

20. The method of claim 1, further including mounting said package in a socket, wherein effective vertical depth of said socket is increased by removing socket material such that a vertical height of said bypass capacitor does not prevent full mounting of said package in said LGA socket;

wherein said socket is an LGA socket if said package is an LGA package; and said socket is a PGA socket if said package is a PGA package.

21. The method as recited in claim 9, wherein said socket is an LGA socket and said package is an LGA package.

22. The method as recited in claim 9, wherein said socket is a PGA socket and said package is a PGA package.

23. A grid-array packaged integrated circuit (IC), including a sub-package mounted bypass capacitor, said packaged IC, with said bypass capacitor, mountable in a socket that defines a recess sized to accept said bypass capacitor, the packaged IC comprising:

the IC, including a first node at a first voltage potential and an second node at a second voltage potential;

a grid-array package, wherein the IC is mounted on the grid-array package, the grid-array package including a first plane to which the first node is coupled and a second plane to which the second node is coupled;

a socket into which the package is inserted, wherein the bypass capacitor is disposed within at least a recess defined in said socket;

a first conductive via formed in the grid-array package between the second node and a lower surface of the package;

a second conductive via formed in the grid-array package beween the second node and the lower surface of the grid-array package, the second conductive via spaced a predetermined distance from the first conductive via, wherein the predetermined distance is approximately equal to the distance between the centers of a first connection and a second connection on the bypass capacitors;

wherein the bypass capacitor is mounted adjacent to a lower surface of the grid-array package such that the first connection on the bypass capacitor makes electrical contact with a lower portion of the first conductive via, and the second connection on the bypass capacitor makes electrical contact with a lower portion of the second conductive via.

24. The IC as recited in claim 23, wherein the grid-array package is a land-grid array (LGA) package.

25. The IC as recited in claim 23, wherein the grid-array package is a ball-grid array (BGA) package.

26. The IC as recited in claim 23, wherein the grid-array package is a pin-grid array (PGA) package.

27. A method of electrically coupling a bypass capacitor between a first node and a second node of an integrated circuit (IC), the first node having a first voltage potential and the second node having a second voltage potential, wherein the IC is mounted on a grid-array package that has a first plane to which the first node is coupled, and has a second plane to which the second node is coupled, the method comprising:

(a) forming a first conductive via between the first nodes and a lower surface of the grid-array package;

(b) forming a second conductive via between the second node and the lower surface of the grid-array package, the second conductive via spaced a predetermined distance from the first conductive via, wherein the predetermined distance is approximately equal to a distance between the centers of a first connection and a second connection on the bypass capacitor;

(c) electrically coupling the first connection of the bypass capacitor to a lower portion of the first conductive via; and (d) electrically coupling the second connection of the bypass capacitor to a lower portion of the second conductive via;

(e) mounting the package in a socket, wherein the socket has a vertical depth exceeding a vertical depth of the bypass capacitor, and wherein the bypass capacitor is disposed within a cavity defined by the socket.

28. The method as recited in claim 27, wherein the grid-array package is a land-grid array (LGA) package.

29. The method as recited in claim 27, wherein the grid-array package is a ball-grid array (BGA) package.

30. The method as recited in claim 27, wherein the grid-array package is a pin-grid array (PGA) package.

31. The method as recited in claim 27, further comprising electrically coupling a second bypass capacitor between the first node and the second node, wherein said electrically coupling a second bypass capacitor comprising:

forming a third conductive via between the first node and the lower surface of the grid array package;

forming a fourth conductive via between the second node and the lower surface of the grid-array package, wherein the fourth conductive via is spaced a predetermined distance from the third conductive via, wherein the predetermined distance is approximately equal to the nominal spaced-apart distance between the centers of a first connection and a second connection on the second bypass capacitor;

electrically coupling the first connection of the second bypass capacitor to a lower portion of the third conductive via; and electrically coupling the second connection of the second bypass capacitor to a lower portion of the fourth conductive via.

* * * * *

UNITED STATES PATENT AND TRADEMARK OFFICE
CERTIFICATE OF CORRECTION

PATENT NO.    : 6,400,576 B1  
DATED         : June 4, 2002  
INVENTOR(S)   : Howard L. Davidson Page 1 of 1

It is certified that error appears in the above-identified patent and that said Letters Patent is hereby corrected as shown below:

Column 10,
Lines 32, 36, 40, 56 and 63, please change "1" to -- 9 --.

Column 11,
Line 22, please change "1" to -- 9 --.
Line 52, please change "second" to -- first --.
Line 61, please change "capacitors" to -- capacitor --.

Column 12,
Line 47, please change "comprising" to -- comprises --.

Signed and Sealed this

Fifteenth Day of April, 2003

JAMES E. ROGAN  
*Director of the United States Patent and Trademark Office*